(12) United States Patent
Slipy et al.

(10) Patent No.: US 7,723,613 B2
(45) Date of Patent: May 25, 2010

(54) ANGLED DOUBLE-WALL JUNCTION

(75) Inventors: Michael J. Slipy, Tamarac, FL (US); Kevin D. Page, West Palm Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 348 days.

(21) Appl. No.: 11/947,992

(22) Filed: Nov. 30, 2007

(65) Prior Publication Data

US 2009/0142536 A1    Jun. 4, 2009

(51) Int. Cl.
*H02G 3/08* (2006.01)
(52) U.S. Cl. .............................. 174/50; 174/58; 174/60; 174/61; 174/135; 174/520; 439/535; 248/906
(58) Field of Classification Search .................. 174/50, 174/58, 60, 520, 135, 61; 220/3.2, 3.3, 4.02; 439/535; 248/906
See application file for complete search history.

(56) References Cited

U.S. PATENT DOCUMENTS

| | | |
|---|---|---|
| 3,970,488 A | 7/1976 | Nelson |
| 3,971,841 A | 7/1976 | Rubinstein |
| 4,366,866 A | 1/1983 | Sweeney |
| 4,463,056 A | 7/1984 | Steele |
| 4,735,753 A | 4/1988 | Ackermann |
| 4,784,591 A | 11/1988 | Ackermann |
| 5,292,484 A | 3/1994 | Kelln et al. |
| 5,326,055 A | 7/1994 | Page et al. |
| 5,557,150 A | 9/1996 | Variot et al. |
| 5,911,531 A | 6/1999 | Fiore |
| 6,701,200 B1 | 3/2004 | Lukis et al. |
| 6,836,699 B2 | 12/2004 | Lukis et al. |
| 6,926,856 B2 | 8/2005 | Hus et al. |
| 7,544,887 B2 * | 6/2009 | Iizuka ........................ 174/50 |
| 7,586,038 B2 * | 9/2009 | Kanamaru et al. ............ 174/50 |
| 7,608,780 B2 * | 10/2009 | McCarthy ..................... 174/50 |
| 7,633,008 B2 * | 12/2009 | Kanou ......................... 174/50 |

* cited by examiner

*Primary Examiner*—Dhiru R Patel
(74) *Attorney, Agent, or Firm*—Cuenot, Forsythe & Kim

(57) ABSTRACT

An enclosure (302), an electronic device (300) that includes the enclosure, and a method (600) for forming the enclosure. The enclosure can include a first enclosure portion (304) and a second enclosure portion (306). The first enclosure portion can include a first wall (410), which can include a first side (412) and at least a second side (414). In one arrangement, an angle (θ) between the first side and the second side is not greater than 70°. The second enclosure portion can include a second wall (420), which can include a third side (422) and at least a fourth side (424). In one arrangement, an angle between the third side and the fourth side is not greater than 70°.

20 Claims, 3 Drawing Sheets

600

```
┌─────────────────────────────────────────────────────────────┐
│ Mold a first enclosure portion to comprise a first wall, the first │
│   wall comprising a first side and a second side, wherein the │
│  angle between the first side and the second side is not greater │
│                        than 70°.                            │
│                                                         602 │
└─────────────────────────────────────────────────────────────┘
```

```
┌─────────────────────────────────────────────────────────────┐
│  Mold a second enclosure portion to comprise a second wall, │
│    the second wall comprising a third side and a fourth side, │
│  wherein the angle between the third side and the fourth side is │
│                     not greater than 70°.                   │
│                                                         604 │
└─────────────────────────────────────────────────────────────┘
```

```
┌─────────────────────────────────────────────────────────────┐
│            Engage the first wall with the second wall.      │
│                                                         606 │
└─────────────────────────────────────────────────────────────┘
```

FIG. 6

ANGLED DOUBLE-WALL JUNCTION

BACKGROUND OF THE INVENTION

1. Field of the Invention

The present invention generally relates to device enclosures.

2. Background of the Invention

Enclosures are frequently used to enclose various items, including electronic circuits. A typical electronic device 100 comprising an enclosure 102 is depicted in FIG. 1. The enclosure 102 usually will include a plurality of enclosure portions 104, 106 that mate along a junction 108.

Oftentimes an electronic device 100 will include one or more audio transducers 110, 112 for transmitting and receiving acoustic signals. In such a device 100, it is generally desirable to acoustically isolate the inside of the enclosure 102 from the outside. Accordingly, steps are sometimes taken to reduce leakage of acoustic signals through the junction 108.

An example of the reduced leakage junction 108 is depicted in FIG. 2, which is an enlarged section view of the communication device 100, taken along section line 2-2. The junction 108 depicted is commonly referred to as a triple-wall junction. In a triple wall junction, one portion, such as the upper portion 104, will have a contoured end 202 in which a channel 204 defines two opposing walls 206, 208. The lower portion 106 will have a contoured end 210 that includes a wall 212 which fits into the channel 204, between the walls 206, 208.

Although the nature in which the ends 202, 210 of the respective portions 104, 106 of the enclosure 102 engage reduces the transfer of acoustic energy through the junction 108, unfortunately the upper portion 104 tends to be rather thick in order to accommodate the wall 212 while providing sufficient structural support for the walls 206, 208. For instance, the thickness, $T_1$, of the upper portion 104 may be approximately 2.3 mm for a small electronic device.

SUMMARY OF THE INVENTION

The present invention relates to an enclosure. The present invention also relates to an electronic device that includes the enclosure. The enclosure can include a first enclosure portion and a second enclosure portion. The first enclosure portion can include a first wall, which can include a first side and at least a second side. In one arrangement, an angle between the first side and the second side is not greater than 70°. The second enclosure portion can include a second wall, which can include a third side and at least a fourth side. In one arrangement, an angle between the third side and the fourth side is not greater than 70°.

The angle between the first side and the second side and/or the angle between the third side and the fourth side can be, for example, in a range of about 65° to about 70°, in a range of about 60° to about 65°, in a range of about 55° to about 60°, in a range of about 50° to about 55°, in a range of about 45° to about 50°, in a range of about 40° to about 45°, in a range of about 35° to about 40°, in a range of about 30° to about 35°, or in a range of about 25° to about 30°.

The first wall can engage the second wall. For example, the first side can engage the third side and the second side can engage the fourth side. The first wall and the second wall form a double-wall junction. The double-wall junction can be an angled double-wall junction.

The first wall further can include a fifth side opposing the first side, and the second side can extend from the first side to the fifth side. Further, the second wall further can include a sixth side opposing the third side, and the fourth side can extend from the third side to the sixth side. In such an arrangement, an angle between the fifth side and the second side need not be greater than 70°. Further, an angle between the sixth side and the fourth side need not be greater than 70°.

A recess can be defined in at least a portion of the first wall. A snap member can be defined on at least a portion of the first wall, and the snap member can be positioned proximate to the defined recess.

The present invention also relates to a method of forming an enclosure. The method can include molding a first enclosure portion to include a first wall. The first wall can include a first side and at least a second side. An angle between the first side and the second side need not be greater than 70°. The method also can include molding a second enclosure portion to include a second wall. The second wall can include a third side and a fourth side. An angle between the third side and the fourth side need not be greater than 70°. Further, the first wall can be engaged with the second wall.

BRIEF DESCRIPTION OF THE DRAWINGS

Preferred embodiments of the present invention will be described below in more detail, with reference to the accompanying drawings, in which:

FIG. 6 is a flowchart presenting a method that is useful for understanding the present invention.

DETAILED DESCRIPTION

While the specification concludes with claims defining features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 1:
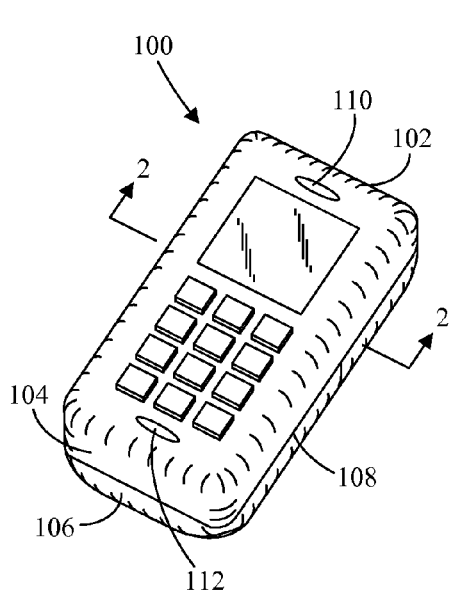
FIG. 1 depicts an electronic device that is useful for understanding the prior art.
Figure 2:
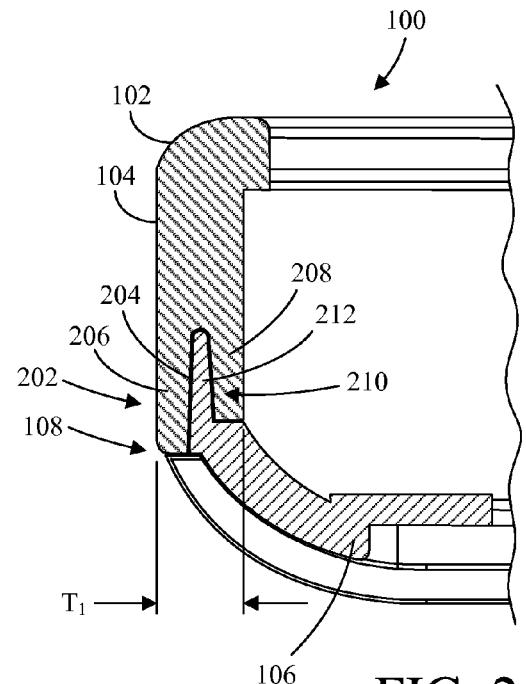
FIG. 2 depicts an enlarged section view of the electronic device of FIG. 1, taken along section line 2-2.
Figure 3:
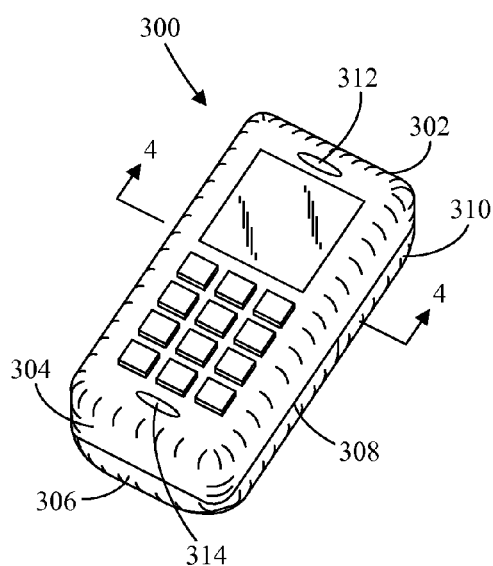
FIG. 3 depicts an electronic device that is useful for understanding the present invention.

FIG. 3 depicts an electronic device 300 that is useful for understanding the present invention. The electronic device 300 can include an enclosure 302 comprising a first enclosure portion 304 and at least a second enclosure portion 306 that mate along at least one junction 308. The first and second enclosure portions 304, 306 can comprise plastic, metal, or any other suitable material(s).

In addition to the first and second enclosure portions 304, 306, the enclosure can include additional portions, for example a battery cover 310. As depicted, the battery cover 310 does not extend the entire length of the electronic device 300, but this need not be the case and the battery cover 310 can indeed extend the entire length.

Further, the electronic device 300 also can include one or more audio transducers, for instance an output audio transducer 312 (e.g. loudspeaker) and an input audio transducer 314 (e.g. microphone). The output audio transducer 312 can generate acoustic signals and the input audio transducer 314 can receive input acoustic signals. Input and output audio transducers are well known to the skilled artisan.

Figure 4:
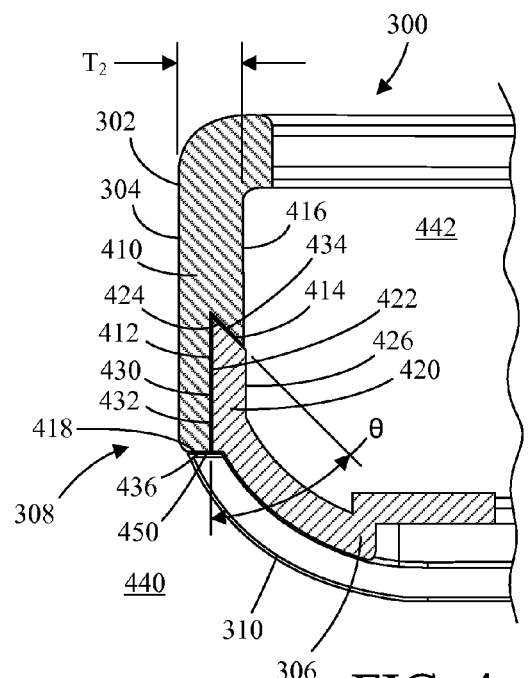
FIG. 4 depicts an enlarged section view of the electronic device of FIG. 3, taken along section line 4-4.

FIG. 4 depicts an enlarged section view of the electronic device 300 of FIG. 3, taken along section line 4-4. The first enclosure portion 304 can include a first wall 410 and the second enclosure portion 306 can include a second wall 420 that engages the first wall 410. In particular, a side 412 of the first wall 410 can engage a side 422 of the second wall 420. Similarly, a side 414 of the first wall 410 can engage a side 424 of the second wall 420. Accordingly, when engaged, the first and second walls 410, 420 can form the junction 308 such that the junction is a "double-wall junction." As used herein, the term "double-wall junction" means a junction formed by two walls that engage one another so as to provide a seam 430 which has a distance from the outside 440 of the enclosure 302 to the inside 442 of the enclosure 302 that is longer than a thickness $T_2$ of the first wall 410.

The side 414 can extend from the side 412 to a side 416 of the first wall 410, and the side 424 can extend from the side 422 to a side 426 of the second wall 420. The sides 412, 414 of the first wall 410 can form an angle, θ, that is equal to or less than 70°. Further, the sides 422, 424 of the second wall 420 also can form an angle, θ, that is equal to or less than 70°. Accordingly, the junction 308 can be referred to as an angled double-wall junction. The respective angles can be, for example, in a range of about 65° to about 70°, in a range of about 60° to about 65°, in a range of about 55° to about 60°, in a range of about 50° to about 55°, in a range of about 45° to about 50°, in a range of about 40° to about 45°, in a range of about 35° to about 40°, in a range of about 30° to about 35°, or in a range of about 25° to about 30°.

Similarly, the sides 414, 416 of the first wall 410 can form an angle, θ, that is equal to or less than 70°, and the sides 424, 426 of the second wall 420 can form an angle, θ, that is equal to or less than 70°. Notwithstanding, the angles formed between the sides 414, 416 of the first wall 410 and the sides 424, 426 of the second wall 420 need to be critical and the invention is not limited in this regard.

The side 426 of the second wall 420 can be aligned with the side 416 of the first wall 410, though this is not a requirement. For instance, the side 426 can be positioned further within the inside 442 of the enclosure 302 than the side 416, or the side 416 can be positioned further within the inside 442 of the enclosure 302 than the side 426.

In the present example, the seam 430 comprises a plurality of seam portions 432, 434 formed by the sides 412, 414 of the first wall 410 and the sides 422, 424 of the second wall 420. For instance, the sides 412, 422 can form a first seam portion 432 and the sides 414, 424 can form a second seam portion 434. Further, the seam 430 also can comprise a seam portion 436 formed between a side 418 of the first wall 410 and a side 450 of the battery cover 310, or other structures of the enclosure 302. Such other structures can include, but are not limited to, other walls (not shown) of the second enclosure portion 306.

The angles formed by the sides 412, 414 of the first wall 410 and the sides 422, 424 of the second wall 420 can facilitate alignment of the first and second walls 410, 420 when the walls 410, 420 are engaged. In particular, the side 414 can guide the side 424 into position. Further, engagement of the side 414 with the side 424 can apply opposing forces to the sides 412, 422 of the respective walls 410, 420, thus insuring that portions 432, 434 of the seam 430 are closely fit.

As noted, the seam 430 can have a distance from the outside 440 of the enclosure 302 to the inside 442 of the enclosure 302 that is longer than a thickness $T_2$ of the first wall 410. Indeed, the cumulative distance of the seam portions 432, 434 can be significantly greater than the thickness $T_2$, thereby providing significant impedance to acoustic signals which may tend to leak through the junction 308. The level of impedance is further enhanced by the close fit provided by the angled double-wall junction 308. Thus, the amount of acoustic energy that would otherwise transfer through the junction 308 during operation of the electronic device 300 is greatly reduced.

Further, because the angled double-wall junction can consist of two walls 410, 420, the thickness $T_2$ of the first wall 410 can be significantly less than the thickness of a corresponding wall of a triple-wall junction of the prior art. For example, for a small electronic device, the thickness $T_2$ of the first wall 410 can be approximately 1.8 mm or less. Accordingly, an overall width of the electronic device 300 can be less than that of an equivalent device that uses a triple-wall junction. Indeed, use of the double-wall junction 308 can save 1.0 mm or more in the overall width and/or length of the electronic device 300, as well as save a corresponding amount of weight. Such size and/or weight reduction may be considered significant for devices designed to be carried on one's person or within a space/weight limited environment, for example within a spacecraft.

Figure 5:
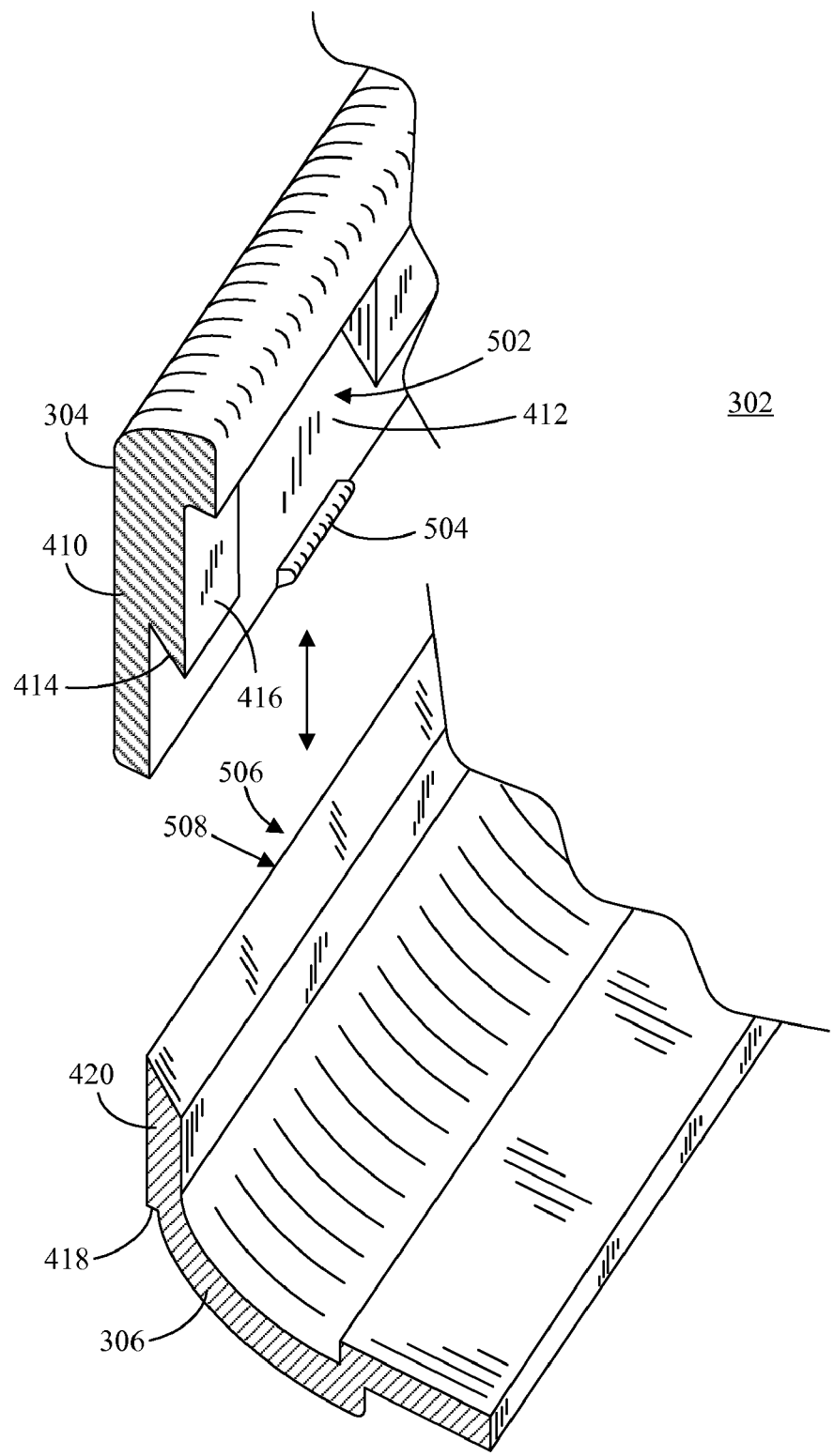
FIG. 5 is an exploded perspective view of an enclosure of the electronic device of FIG. 3, taken along section line 4-4.

FIG. 5 is an exploded perspective view of the enclosure 302 of the electronic device of FIG. 3, taken along section line 4-4. A recess 502 can be defined in the first enclosure portion 304. The recess 502 can be defined by removing a portion of the first wall 410 in an area of the wall 410 proximate to a snap member 504. For instance, in the region of the recess 502, the sides 414, 416 of the first wall 410 can be removed so as to form an enlarged area of the side 412 which, in a direction away from the snap member 504, extends beyond the side 414.

The recess 502 can allow for flexure of the second wall 420 of the second enclosure portion 306 in a region 506 that is proximate to the snap member 504 when the second wall 420 engages the first wall 410. In particular the region 506 can flex in a direction 508 away from the snap member 504. After the side 418 has passed the snap member 504, the region 506 can return to a non-flexed position.

It should be noted that the snap member 504 depicted is but one example of a snap member 504 that can be implemented, but a myriad of other types of snap members and/or snap features can be implemented, and such snap members and/or snap features can be located on either of the first and second walls 410, 420. Alternatively, snap members and/or snap features can be provided which are incorporated into other portions of a device. Accordingly, the present invention is not limited in this regard.

FIG. 6 is a flowchart presenting a method 600 that is useful for understanding the present invention. At step 602, a first enclosure portion can be molded to comprise a first wall. The first wall can comprise a first side and a second side, wherein the angle between the first side and the second side is not greater than 70°. At step 604, a second enclosure portion can be molded to comprise a second wall. The second wall can comprise a third side and a fourth side, wherein the angle between the third side and the fourth side is not greater than 70°. At step 606 the first wall can be engaged with the second wall.

The flowchart and block diagrams in the figures illustrate the architecture, functionality and methods according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language).

This invention can be embodied in other forms without departing from the spirit or essential attributes thereof. Accordingly, reference should be made to the following claims, rather than to the foregoing specification, as indicating the scope of the invention.

What is claimed is:

1. An enclosure, comprising:
   a first enclosure portion comprising a first wall, the first wall comprising:
      a first side; and
      at least a second side;
      wherein an angle between the first side and the second side is not greater than 70°; and
   a second enclosure portion comprising a second wall, the second wall comprising:
      a third side; and
      at least a fourth side;
      wherein an angle between the third side and the fourth side is not greater than 70°;
   wherein the first wall engages the second wall.

2. The enclosure of claim 1, wherein the first side engages the third side and the second side engages the fourth side.

3. The enclosure of claim 1, wherein:
   the first wall further comprises a fifth side opposing the first side, and the second side extends from the first side to the fifth side; and
   the second wall further comprises a sixth side opposing the third side, and the fourth side extends from the third side to the sixth side.

4. The enclosure of claim 3, wherein:
   an angle between the fifth side and the second side is not greater than 70°; and
   an angle between the sixth side and the fourth side is not greater than 70°.

5. The enclosure of claim 1, wherein the first wall and the second wall form a double-wall junction.

6. The enclosure of claim 1, wherein the first wall and the second wall form an angled double-wall junction.

7. The enclosure of claim 1, wherein a recess is defined in at least a portion of the first wall.

8. The enclosure of claim 7, wherein a snap member is defined on at least a portion of the first wall, the snap member positioned proximate to the defined recess.

9. The enclosure of claim 1, wherein at least one angle selected from the group consisting of the angle between the first side and the second side and the angle between the third side and the fourth side is in a range of about 65° to about 70°.

10. The enclosure of claim 1, wherein at least one angle selected from the group consisting of the angle between the first side and the second side and the angle between the third side and the fourth side is in a range of about 60° to about 65°.

11. The enclosure of claim 1, wherein at least one angle selected from the group consisting of the angle between the first side and the second side and the angle between the third side and the fourth side is in a range of about 55° to about 60°.

12. The enclosure of claim 1, wherein at least one angle selected from the group consisting of the angle between the first side and the second side and the angle between the third side and the fourth side is in a range of about 50° to about 55°.

13. The enclosure of claim 1, wherein at least one angle selected from the group consisting of the angle between the first side and the second side and the angle between the third side and the fourth side is in a range of about 45° to about 50°.

14. The enclosure of claim 1, wherein at least one angle selected from the group consisting of the angle between the first side and the second side and the angle between the third side and the fourth side is in a range of about 40° to about 45°.

15. The enclosure of claim 1, wherein at least one angle selected from the group consisting of the angle between the first side and the second side and the angle between the third side and the fourth side is in a range of about 35° to about 40°.

16. The enclosure of claim 1, wherein at least one angle selected from the group consisting of the angle between the first side and the second side and the angle between the third side and the fourth side is in a range of about 30° to about 35°.

17. The enclosure of claim 1, wherein at least one angle selected from the group consisting of the angle between the first side and the second side and the angle between the third side and the fourth side is in the range of about 25° to about 30°.

18. An electronic device comprising:
   an enclosure comprising:
      a first enclosure portion comprising a first wall, the first wall comprising:
         a first side; and
         at least a second side;
         wherein an angle between the first side and the second side is not greater than 70°; and
      a second enclosure portion comprising a second wall, the second wall comprising:
         a third side; and
         at least a fourth side;
         wherein an angle between the third side and the fourth side is not greater than 70°;
      wherein the first wall engages the second wall.

19. The electronic device of claim 18, wherein the first side engages the third side and the second side engages the fourth side.

20. A method of forming an enclosure, comprising:
   molding a first enclosure portion to comprise a first wall, the first wall comprising:
      a first side; and
      at least a second side;
      wherein an angle between the first side and the second side is not greater than 70°;
   molding a second enclosure portion to comprise a second wall, the second wall comprising:
      a third side; and
      at least a fourth side;
      wherein an angle between the third side and the fourth side is not greater than 70°; and
   engaging the first wall with the second wall.

* * * * *